(12) United States Patent
Li et al.

(10) Patent No.: US 6,867,126 B1
(45) Date of Patent: Mar. 15, 2005

(54) METHOD TO INCREASE CRACKING THRESHOLD FOR LOW-K MATERIALS

(75) Inventors: Lih-Ping Li, Hsinchu (TW); Yung-Chen Lu, Taipei (TW); Chung-Chi Ko, Nantou (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/289,718

(22) Filed: Nov. 7, 2002

(51) Int. Cl.[7] .................... H01L 21/4763; H01L 21/26
(52) U.S. Cl. .................. 438/622; 438/623; 438/703; 438/782; 438/787
(58) Field of Search ................ 438/622, 623, 438/637, 703, 782, 787

(56) References Cited

U.S. PATENT DOCUMENTS

| | | | | |
|---|---|---|---|---|
| 5,468,560 A | * | 11/1995 | McPherson et al. | 428/413 |
| 6,028,015 A | * | 2/2000 | Wang et al. | 438/789 |
| 6,030,901 A | | 2/2000 | Hopper et al. | 438/711 |
| 6,043,147 A | | 3/2000 | Chen et al. | 438/624 |
| 6,103,601 A | | 8/2000 | Lee et al. | 438/513 |
| 6,114,259 A | * | 9/2000 | Sukharev et al. | 438/789 |
| 6,124,216 A | | 9/2000 | Ko et al. | 438/766 |
| 6,153,512 A | | 11/2000 | Chang et al. | 438/624 |
| 6,171,951 B1 | | 1/2001 | Lee et al. | 438/640 |
| 6,242,338 B1 | | 6/2001 | Liu et al. | 438/622 |
| 6,284,149 B1 | * | 9/2001 | Li et al. | 216/64 |
| 6,284,644 B1 | * | 9/2001 | Aug et al. | 438/623 |
| 6,358,838 B2 | * | 3/2002 | Furusawa et al. | 438/622 |
| 6,514,850 B2 | * | 2/2003 | Xia et al. | 438/622 |
| 6,566,283 B1 | * | 5/2003 | Pangrle et al. | 438/788 |
| 6,569,777 B1 | * | 5/2003 | Hsu et al. | 438/725 |
| 6,583,048 B1 | * | 6/2003 | Vincent et al. | 438/623 |
| 6,605,549 B2 | * | 8/2003 | Leu et al. | 438/758 |
| 6,656,837 B2 | * | 12/2003 | Xu et al. | 438/676 |
| 6,777,171 B2 | * | 8/2004 | Xu et al. | 430/322 |

* cited by examiner

Primary Examiner—Michael S. Lebentritt
(74) Attorney, Agent, or Firm—Haynes and Boone, LLP

(57) ABSTRACT

A method of increasing the cracking threshold of a low-k material layer comprising the following steps. A substrate having a low-k material layer formed thereover is provided. The low-k material layer having a cracking threshold. The low-k material layer is plasma treated to increase the low-k material layer cracking threshold. The plasma treatment including a gas that is $CO_2$, He, $NH_3$ or combinations thereof.

37 Claims, 2 Drawing Sheets

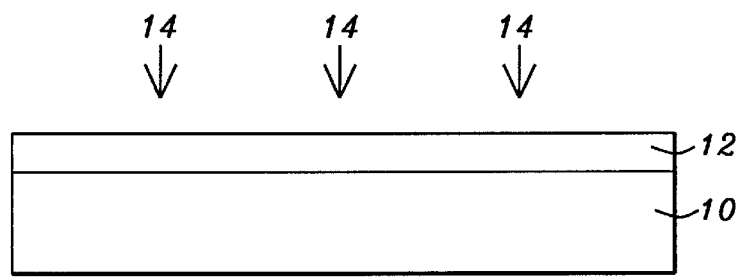
FIG. 1
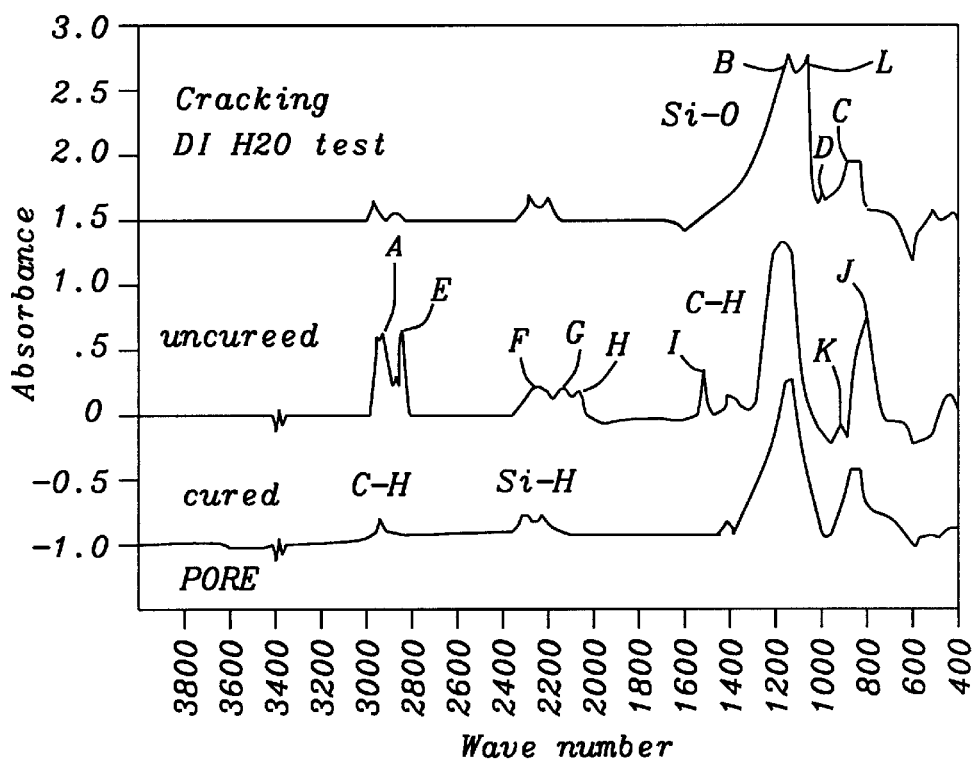
FIG. 2a
| Peak | Wave Number | |
|---|---|---|
| A | 2935.625 | 0.026 |
| B | 1107.138 | 0.013 |
| C | 878.085 | 0.004 |
| D | 985.488 | 0.004 |
| E | 2861.496 | 0.046 |
| F | 2238.690 | 0.011 |
| Peak | Wave Number | |
|---|---|---|
| G | 2166.065 | 0.005 |
| H | 2118.476 | 0.001 |
| I | 1473.619 | 0.034 |
| J | 832.238 | 0.078 |
| K | 941.079 | 0.017 |
| L | 1061.621 | 0.058 |
FIG. 2b

| Peak | Wave Number | |
|---|---|---|
| M | 2958.066 | 0.070 |
| N | 2866.435 | 0.022 |
| O | 2242.572 | 0.018 |
| P | 2116.641 | 0.016 |
| Q | 2116.063 | 0.006 |
| R | 1470.565 | 0.017 |

| Peak | Wave Number | |
|---|---|---|
| S | 1069.011 | 0.139 |
| T | 940.855 | 0.008 |
| U | 880.665 | 0.056 |
| V | 842.283 | 0.025 |

METHOD TO INCREASE CRACKING THRESHOLD FOR LOW-K MATERIALS

FIELD OF THE INVENTION

The present invention relates generally to semiconductor fabrication and more specifically to methods of increasing the cracking threshold of low-k material layers.

BACKGROUND OF THE INVENTION

Some low-k materials can not be applied to integrated circuit fabrication because of cracking issues. One attempt to increase cracking thresholds of low-k materials is to use etch-stop architecture however this decays the RC performance. Another method has been to change the precursors used to form the low-k materials. Generally, the low-k film is deposited and then cured to increase the cracking threshold.

U.S. Pat. No. 6,242,338 B1 to Liu et al. describes an $N_2$ plasma treatment of a low-k layer.

U.S. Pat. No. 6,124,216 to Ko et al. describes a plasma treatment of a low-k layer.

U.S. Pat. Nos. 6,103,601 to Lee et al. and 6,028,015 to Wang et al. describe other plasma treatments of low-k layers.

U.S. Pat. No. 6,030,901 to Hopper et al. describes a plasma treatment to remove photoresist over low-k materials.

U.S. Pat. Nos. 6,153,512 to Chang et al., 6,171,951 B1 to Lee et al. and 6,043,147 to Chen et al. describe related low-k treatments.

SUMMARY OF THE INVENTION

Accordingly, it is an object of one or more embodiments of the present invention to provide a method of increasing the cracking threshold of low-k dielectric layers.

Other objects will appear hereinafter.

It has now been discovered that the above and other objects of the present invention may be accomplished in the following manner. Specifically, a substrate having a low-k material layer formed thereover is provided. The low-k material layer having a cracking threshold. The low-k material layer is plasma treated to increase the low-k material layer cracking threshold. The plasma treatment including a gas that is $CO_2$, He, $NH_3$ or combinations thereof.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIG. 1 schematically illustrates a preferred embodiment of the present invention.

FIGS. 2a and 3a are graphs illustrating the bonds present in untreated low-k material layers and in low-k material layers treated in accordance with the present invention.

FIGS. 2b and 3b are charts identifying the wave number of peaks A to L in FIG. 2a and peaks M to V in FIG. 3a, respectively.

DETAILED DESCRIPTION OF THE PREFERRED EMBODIMENT

Figures 3A, 3B:
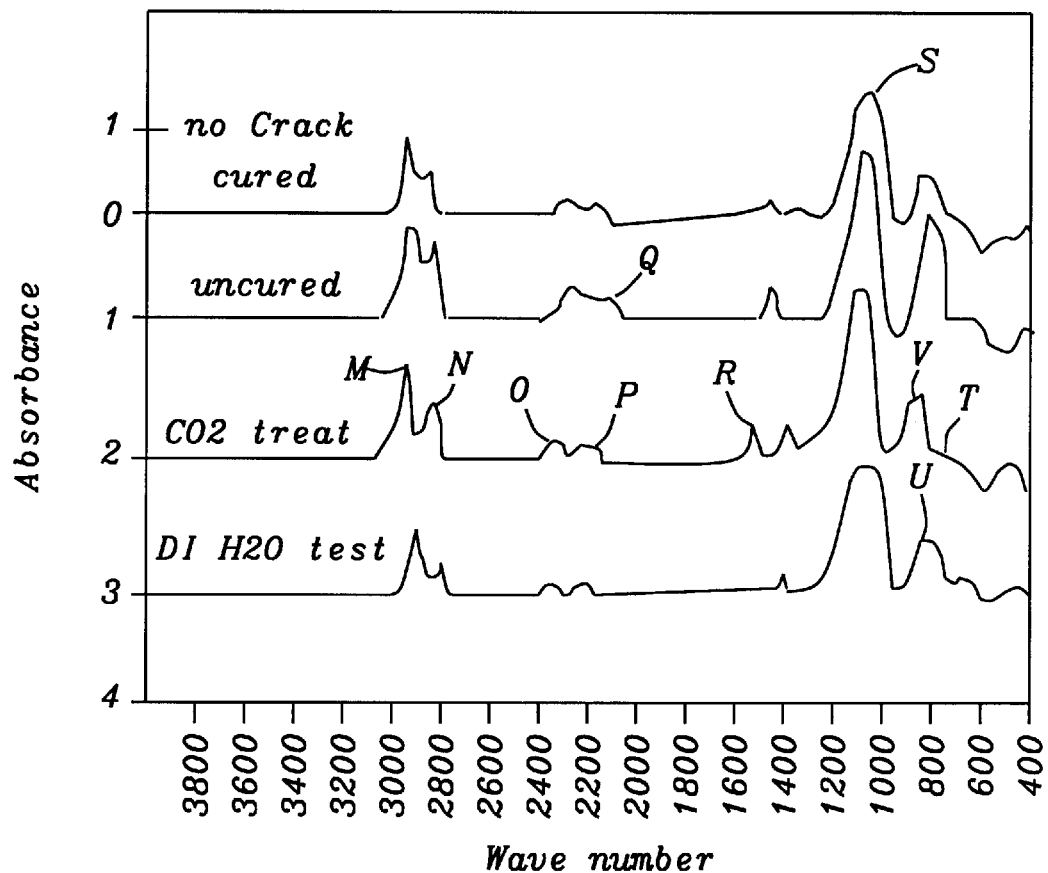

Unless otherwise specified, all structures, layers, steps, methods, etc. may be formed or accomplished by conventional steps or methods known in the prior art.

The method of the present invention includes forming the low-k material and then subjecting the low-k material to the novel plasma treatment of the present invention which does not degrade the dielectric constant of the low-k material. A subsequent curing process may or may not then be performed.

Initial Structure

As shown in FIG. 1, structure 10 includes an uncured low-k dielectric material layer 12 formed thereover. A low-k dielectric material for the purposes of this invention is one having a dielectric constant of less than about 3.0. Low-k dielectric material layer 12 is preferably comprised of CVD low-k dielectric material, spin-on low-k dielectric material, Black Diamond™ or PORA™ (SiCOH) and is more preferably CVD low-k dielectric material. Low-k layer 12 has an unacceptable cracking threshold due to, for example, weak mechanical strength.

Structure 10 is understood to possibly include a semiconductor wafer or substrate preferably comprised of silicon, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

Plasma Treatment 14 of The Low-k Material Layer 12

In a key step of the invention and as shown in FIG. 1, a plasma treatment 14 is applied to the uncured low-k layer 12. The plasma treatment 14 uses either $CO_2$, He, $NH_3$ or a combination of these gasses at the following parameters:

$CO_2$ gas: preferably from about 0 to 3000 sccm and more preferably from about 0 to greater than about 500 sccm;

He gas: preferably from about 0 to 4000 sccm and more preferably from about 0 to 2000 sccm;

$NH_3$ gas: preferably from about 0 to 3000 sccm and more preferably from about 0 to 2000 sccm; and/or $H_2$ gas: preferably from about 0 to 3000 sccm and more preferably from about 0 to 1600 sccm; at temperature: preferably from about 20 to 400° C.;

pressure: preferably from about 1.5 to 7 mTorr;

power: preferably from about 0 to 2000 Watts; and time: preferably from about 1 to 20 seconds.

The plasma treatment 14 also employs an oxygen content gas or a reduction gas. The oxygen content gas is preferably $CO_2$, CO, $O_2$, $N_2O$ or $NO_2$. The reduction gas is preferably $NH_3$ or $SiH_4$.

The plasma treatment 14 of the present invention increases the cracking threshold of the low-k material of preferably from about 3000 Å to 30,000 Å and more preferably up to about 1.5 μm.

As illustrated in the graphs of FIGS. 2a and 3a, the inventors believe that the cracking threshold of the low-k layer 12 is increased because the plasma treatment 14 changes the structure of the low-k material. FIGS. 2b and 3b are charts identifying the wave number of peaks A to L in FIG. 2a and peaks M to V in FIG. 3a, respectively.

Thus, the plasma 14 treated low-k layer 12 becomes hydrophobic as determined by a deionized water (DI) test and bulky (long chain) groups protect the Si—H bonds. The Si—H bonds are inert and stable which thus improves the cracking threshold of the low-k layer 12. The inventors have determined that the cracking threshold of low-k layer 12 treated in accordance with the present invention increased to from about 3000 Å to 1.5 μm.

The plasma 14 treated low-k layer 12 may then be left uncured or may be cured by, for example, a furnace anneal.

Curing is not necessary to improve the cracking threshold of the plasma 14 treated low-k layer 12. For a spin-on low-k dielectric layer 12, any known curing process may be used while some CVD low-k dielectric layers 12 formed using a low-temperature deposition (less than about 400° C.) should be cured.

Advantages of the Present Invention

The advantages of one or more embodiments of the present invention include:

1. the thermobudget to increase the cracking threshold of a low-k material layer is decreased;
2. the throughput is increased;
3. the cracking threshold of low-k material layers is increased; and
4. lower the dielectric constant.

While particular embodiments of the present invention have been illustrated and described, it is not intended to limit the invention, except as defined by the following claims.

We claim:

1. A method of increasing the cracking threshold of a low-k material layer, comprising the steps of:
    providing a substrate having a low-k material layer formed thereover; the low-k material layer having a cracking threshold; and
    plasma treating the low-k material layer to increase the low-k material layer cracking threshold; the plasma treatment including a gas that is $CO_2$, He, $NH_3$ or combinations thereof, wherein the plasma treatment of the low-k material layer changes the structure of the low-k material layer to protect the existing Si—H bonds within the low-k material layer.

2. The method of claim 1, including the step of then curing the plasma treated low-k material layer.

3. The method of claim 1, wherein the plasma treated low-k material layer is not subsequently cured.

4. The method of claim 1, wherein the plasma treatment is conducted at the following parameters:
    $CO_2$ gas: from about 0 to 3000 sccm; He gas: from about 0 to 4000 sccm; $NH_3$ gas: from about 0 to 3000 sccm; or $H_2$ gas: from about 0 to 3000 sccm;
    temperature: from about 20 to 400° C.;
    pressure: from about 1.5 to 7 mTorr;
    power: from about 0 to 2000 Watts; and
    time: from about 1 to 20 seconds.

5. The method of claim 1, wherein the plasma treatment is conducted at the following parameters:
    $CO_2$ gas: from about 0 to greater than about 500 sccm; He gas: from about 0 to 2000 sccm; $NH_3$ gas: from about 0 to 2000 sccm; or $H_2$ gas: from about 0 to 1600 sccm;
    temperature: preferably from about 20 to 400° C.;
    pressure: preferably from about 1.5 to 7 mTorr;
    power: preferably from about 0 to 2000 Watts; and
    time: preferably from about 1 to 20 seconds.

6. The method of claim 1, wherein the low-k material layer is comprised of a CVD low-k dielectric material, a spin-on low-k dielectric material, Black Diamond™ or PORA™.

7. The method of claim 1, wherein the low-k material layer is comprised of a CVD low-k material.

8. The method of claim 1, wherein the plasma treatment of the low-k material layer changes the structure of the low-k material layer.

9. The method of claim 1, wherein the plasma treatment of the low-k material layer is hydrophobic or hydrophilic.

10. The method of claim 1, wherein the plasma treated low-k material layer is more hydrophobic than the initial low-k material layer.

11. The method of claim 1, wherein the substrate is a silicon substrate.

12. The method of claim 1, wherein the plasma treatment includes an oxygen content gas or a reduction gas.

13. The method of claim 1, wherein the plasma treatment includes an oxygen content gas or a reduction gas; wherein the oxygen content gas is $CO_2$, CO, $O_2$, $N_2O$ or $NO_2$ and the reduction gas is $NH_3$ or $SiH_4$.

14. A method of increasing the cracking threshold of a low-k material layer, comprising the steps of:
    providing a substrate having a low-k material layer formed thereover; the low-k material layer having a cracking threshold; and
    plasma treating the low-k material layer to increase the low-k material layer cracking threshold; the plasma treatment including a gas that is $CO_2$, He, $NH_3$ or combinations thereof; the plasma treatment further including an oxygen content gas or a reduction gas, wherein the plasma treatment of the low-k material layer changes the structure of the low-k material layer to protect the existing Si—H bonds within the low-k material layer.

15. The method of claim 14, including the step of then curing the plasma treated low-k material layer.

16. The method of claim 14, wherein the plasma treated low-k material layer is not subsequently cured.

17. The method of claim 14, wherein the plasma treatment is conducted at the following parameters:
    $CO_2$ gas: from about 0 to 3000 sccm; He gas: from about 0 to 4000 sccm; $NH_3$ gas: from about 0 to 3000 sccm; or $H_2$ gas: from about 0 to 3000 sccm;
    temperature: from about 20 to 400° C.;
    pressure: from about 1.5 to 7 mTorr;
    power: from about 0 to 2000 Watts; and
    time: from about 1 to 20 seconds.

18. The method of claim 14, wherein the plasma treatment is conducted at the following parameters:
    $CO_2$ gas: from about 0 to greater than about 500 sccm; He gas: from about 0 to 2000 sccm; $NH_3$ gas: from about 0 to 2000 sccm; or $H_2$ gas: from about 0 to 1600 sccm;
    temperature: preferably from about 20 to 400° C.;
    pressure: preferably from about 1.5 to 7 mTorr;
    power: preferably from about 0 to 2000 Watts; and
    time: preferably from about 1 to 20 seconds.

19. The method of claim 14, wherein the low-k material layer is comprised of a CVD low-k dielectric material, a spin-on low-k dielectric material, Black Diamond™ or PORA™.

20. The method of claim 14, wherein the low-k material layer is comprised of a CVD low-k material.

21. The method of claim 14, wherein the plasma treatment of the low-k material layer changes the structure of the low-k material layer.

22. The method of claim 14, wherein the plasma treatment of the low-k material layer is hydrophobic or hydrophilic.

23. The method of claim 14, wherein the plasma treated low-k material layer is more hydrophobic than the initial low-k material layer.

24. The method of claim 14, wherein the substrate is a silicon substrate.

25. The method of claim 14, wherein the oxygen content gas is $CO_2$, CO, $O_2$, $N_2O$ or $NO_2$; and the reduction gas is $NH_3$ or $SiH_4$.

26. A method of increasing the cracking threshold of a low-k material layer, comprising the steps of:

provriding a substrate having a low-k material layer formed thereover; the low-k material layer having a cracking threshold; and plasma treating the low-k material layer to increase the low-k material layer cracking threshold; the plasma treatment including a gas that is $CO_2$, He, $NH_3$ or combinations thereof; wherein the plasma treatment of the low-k material layer changes the structure of the low-k material layer to protect the existing Si—H bonds within the low-k material layer; wherein the plasma treatment is conducted at the following parameters:

$CO_2$ gas: from about 0 to 3000 sccm; He gas: from about 0 to 4000 sccm; $NH_3$ gas: from about 0 to 3000 sccm; or $H_2$ gas: from about 0 to 3000 sccm;
temperature: from about 20 to 400° C.;
pressure: from about 1.5 to 7 mTorr;
power: from about 0 to 2000 Watts; and
time: from about 1 to 20 seconds.

27. The method of claim 26, including the step of then curing the plasma treated low-k material layer.

28. The method of claim 26, wherein the plasma treated low-k material layer is not subsequently cured.

29. The method of claim 26, wherein the plasma treatment is conducted at the following parameters:

$CO_2$ gas: from about 0 to greater than about 500 sccm; He gas: from about 0 to 2000 sccm; $NH_3$ gas: from about 0 to 2000 sccm; or $H_2$ gas: from about 0 to 1600 sccm;
temperature: preferably from about 20 to 400° C.;
pressure: preferably from about 1.5 to 7 mTorr;
power: preferably from about 0 to 2000 Watts; and
time: preferably from about 1 to 20 seconds.

30. The method of claim 26, wherein the low-k material layer is a CVD low-k dielectric material, a spin-on low-k dielectric material, Black Diamond™ or PORA™.

31. The method of claim 26, wherein the low-k material layer is comprised of a CVD low-k material.

32. The method of claim 26, wherein the plasma treatment of the low-k material layer changes the structure of the low-k material layer.

33. The method of claim 26, wherein the plasma treatment of the low-k material layer is hydrophobic or hydrophilic.

34. The method of claim 26, wherein the plasma treated low-k material layer is more hydrophobic than the initial low-k material layer.

35. The method of claim 26, wherein the substrate is a silicon substrate.

36. The method of claim 26, wherein the plasma treatment includes an oxygen content gas or a reduction gas.

37. The method of claim 26, wherein the plasma treatment includes an oxygen content gas or a reduction gas; wherein the oxygen content gas is $CO_2$, CO, $O_2$, $N_2O$ or $NO_2$; and the reduction gas is $NH_3$ or $SiH_4$.

* * * * *